United States Patent
Kawashima et al.

(10) Patent No.: US 11,744,164 B2
(45) Date of Patent: Aug. 29, 2023

(54) RESISTIVE RANDOM ACCESS MEMORY DEVICE AND METHOD FOR MANUFACTURING THE SAME

(71) Applicant: Kioxia Corporation, Minato-ku (JP)

(72) Inventors: Tomohito Kawashima, Yokohama (JP); Takahiro Nonaka, Yokkaichi (JP); Yusuke Arayashiki, Yokkaichi (JP); Takayuki Ishikawa, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 84 days.

(21) Appl. No.: 14/631,242

(22) Filed: Feb. 25, 2015

(65) Prior Publication Data

US 2016/0064661 A1 Mar. 3, 2016

(30) Foreign Application Priority Data

Sep. 3, 2014 (JP) ................. 2014-178787

(51) Int. Cl.
*H01L 45/00* (2006.01)
*H01L 27/24* (2006.01)
(Continued)

(52) U.S. Cl.
CPC ......... *H10N 70/826* (2023.02); *H10N 70/011* (2023.02); *H10N 70/24* (2023.02);
(Continued)

(58) Field of Classification Search
CPC .......................... H01L 45/1233; H01L 45/085
See application file for complete search history.

(56) References Cited

U.S. PATENT DOCUMENTS 6,885,580 B2 * 4/2005 Baker
2004/0159828 A1 * 8/2004 Rinerson ............. G11C 11/5685
257/2
(Continued)

FOREIGN PATENT DOCUMENTS

CN 1848446 A 10/2006
CN 101636841 A 1/2010
(Continued)

OTHER PUBLICATIONS

Office Action dated May 24, 2016, in Taiwan Patent Application No. 104128910 (with English-language Translation).

*Primary Examiner* — Samuel A Gebremariam
*Assistant Examiner* — Jonas T Beardsley
(74) *Attorney, Agent, or Firm* — Oblon, McClelland, Maier & Neustadt, L.L.P.

(57) ABSTRACT

According to one embodiment, a resistive random access memory device includes a first electrode and a second electrode. The resistive random access memory device also includes a resistance change layer connected between the first electrode and the second electrode. The resistive random access memory device also includes a conductive layer connected in series to the resistance change layer between the first electrode and the second electrode. The resistive random access memory device in which the conductive layer includes a plurality of first material layers including a first material and a plurality of second material layers including a second material which is different from the first material.

25 Claims, 8 Drawing Sheets

(51) Int. Cl.
  *H10N 70/00*  (2023.01)
  *H10N 70/20*  (2023.01)
  *H10B 63/00*  (2023.01)

(52) U.S. Cl.
  CPC ......... *H10N 70/245* (2023.02); *H10N 70/841* (2023.02); *H10N 70/8416* (2023.02); *H10N 70/8833* (2023.02); *H10B 63/84* (2023.02)

(56) References Cited

U.S. PATENT DOCUMENTS

| | | | |
|---|---|---|---|
| 2007/0054475 A1* | 3/2007 | Lee | C23C 16/305 438/483 |
| 2007/0187801 A1* | 8/2007 | Asao | H01L 27/2436 257/613 |
| 2008/0316794 A1* | 12/2008 | Philipp | H01L 45/1666 365/148 |
| 2009/0231910 A1* | 9/2009 | Liu | H01L 45/142 365/163 |
| 2010/0061142 A1 | 3/2010 | Arita et al. | |
| 2011/0305064 A1* | 12/2011 | Jo | G11C 13/0002 365/148 |
| 2013/0033923 A1* | 2/2013 | Kuo et al. | |
| 2013/0094278 A1* | 4/2013 | Hou | G11C 13/0007 365/148 |
| 2013/0099190 A1* | 4/2013 | Oh | H01L 27/2463 257/4 |
| 2013/0328008 A1 | 12/2013 | Miyagawa et al. | |
| 2014/0070161 A1 | 3/2014 | Sugimae et al. | |
| 2014/0103284 A1 | 4/2014 | Hsueh et al. | |
| 2014/0284543 A1* | 9/2014 | Ishikawa | H01L 45/148 257/4 |
| 2014/0299834 A1 | 10/2014 | Pramanik et al. | |

FOREIGN PATENT DOCUMENTS

| | | |
|---|---|---|
| CN | 101971264 A | 2/2011 |
| CN | 102623045 A | 8/2012 |
| CN | 103988264 A | 8/2014 |
| JP | 2010-527151 A | 8/2010 |
| JP | 2012-227275 | 11/2012 |
| JP | 2014-53522 A | 3/2014 |
| WO | WO 2013/043561 A1 | 3/2013 |

\* cited by examiner

RESISTIVE RANDOM ACCESS MEMORY DEVICE AND METHOD FOR MANUFACTURING THE SAME

CROSS-REFERENCE TO RELATED APPLICATIONS

This application is based upon and claims the benefit of priority from Japanese Patent Application No. 2014-178787, filed on Sep. 3, 2014; the entire contents of which are incorporated herein by reference.

FIELD

Embodiments described herein relate generally to a resistive random access memory device and a method for manufacturing the same.

BACKGROUND

Recently, the development of a two-terminal resistive random access memory device typified by a ReRAM (resistive random access memory) has been actively carried out. This resistive random access memory device enables low-voltage operation, high-speed switching, and miniaturization, and therefore is a potent candidate for a next-generation large-capacity memory device to replace a floating-gate type NAND flash memory. As a large-capacity memory device using this resistive random access memory device as a memory cell, a memory with a cross-point structure has been proposed.

In a memory with a cross-point structure, when an excessive current flows through a memory cell, the memory cell is destroyed, and therefore, it is preferred to suppress a current by a method in which a load resistance is connected in series to the memory cell, or the like.

A material of such a load resistance preferably has a higher resistivity than a material to be used for an interconnection or the like and has substantially linear current-voltage characteristics. For example, insulating materials such as silicon nitride (SiN), silicon oxide (SiO$_2$), and aluminum nitride (AlN), each of which has insulating properties, have a high resistance, but do not have linear current-voltage characteristics, and therefore are not so suitable as a material of a load resistance.

DETAILED DESCRIPTION

According to one embodiment, a resistive random access memory device includes a first electrode and a second electrode. The resistive random access memory device also includes a resistance change layer connected between the first electrode and the second electrode. The resistive random access memory device also includes a conductive layer connected in series to the resistance change layer between the first electrode and the second electrode. The resistive random access memory device in which the conductive layer includes a plurality of first material layers including a first material and a plurality of second material layers including a second material which is different from the first material.

According to one embodiment, a resistive random access memory device includes a first electrode and a second electrode. The resistive random access memory device also includes a resistance change layer connected between the first electrode and the second electrode. The resistive random access memory device also includes a conductive layer connected in series to the resistance change layer between the first electrode and the second electrode, having resistivity higher than resistivity of the first electrode and the second electrode, and including at least a first element and a second element. A concentration profile of the first element along a direction from the first electrode to the second electrode in the conductive layer repeating high and low concentrations.

According to one embodiment, a method for manufacturing a resistive random access memory device includes forming a resistance change layer on a first electrode and forming a second electrode on the resistance change layer. The method for manufacturing a resistive random access memory device also includes forming a conductive layer having resistivity higher than resistivity of the first electrode and the second electrode so as to be connected to the first electrode or the second electrode. The method for manufacturing a resistive random access memory device also includes the forming a conductive layer including forming a first material layer by depositing a first material and forming a second material layer including a second material which is different from the first material. The forming the first material layer and the forming the second material layer being repeated a plurality of times.

Hereinafter, embodiments of the invention will be described with reference to the drawings.

First, a first embodiment will be described.

Figure 1:
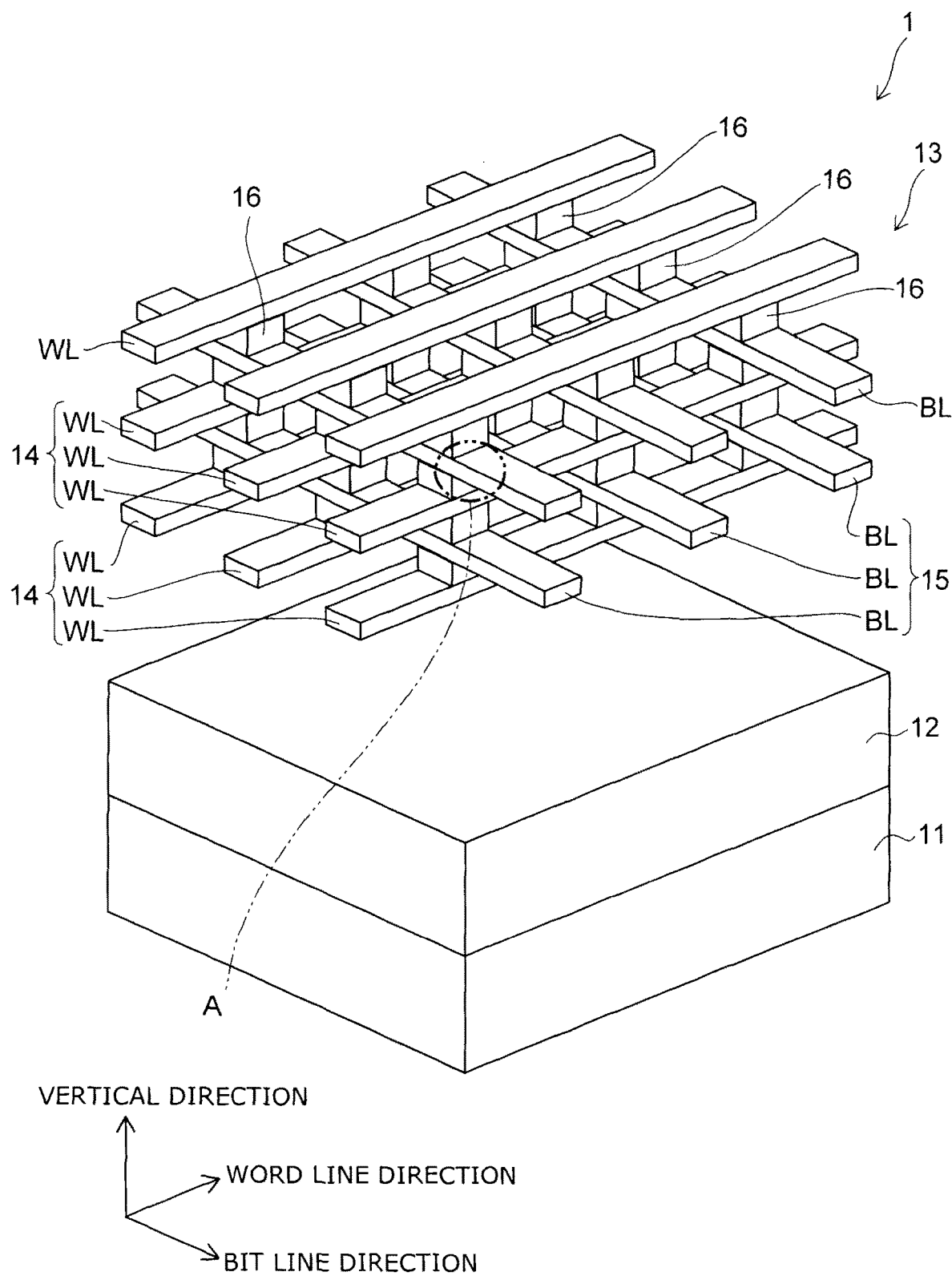
FIG. 1 is a perspective view illustrating a resistive random access memory device according to a first embodiment.

FIG. 1 is a perspective view illustrating a resistive random access memory device according to the embodiment.

Figure 2:
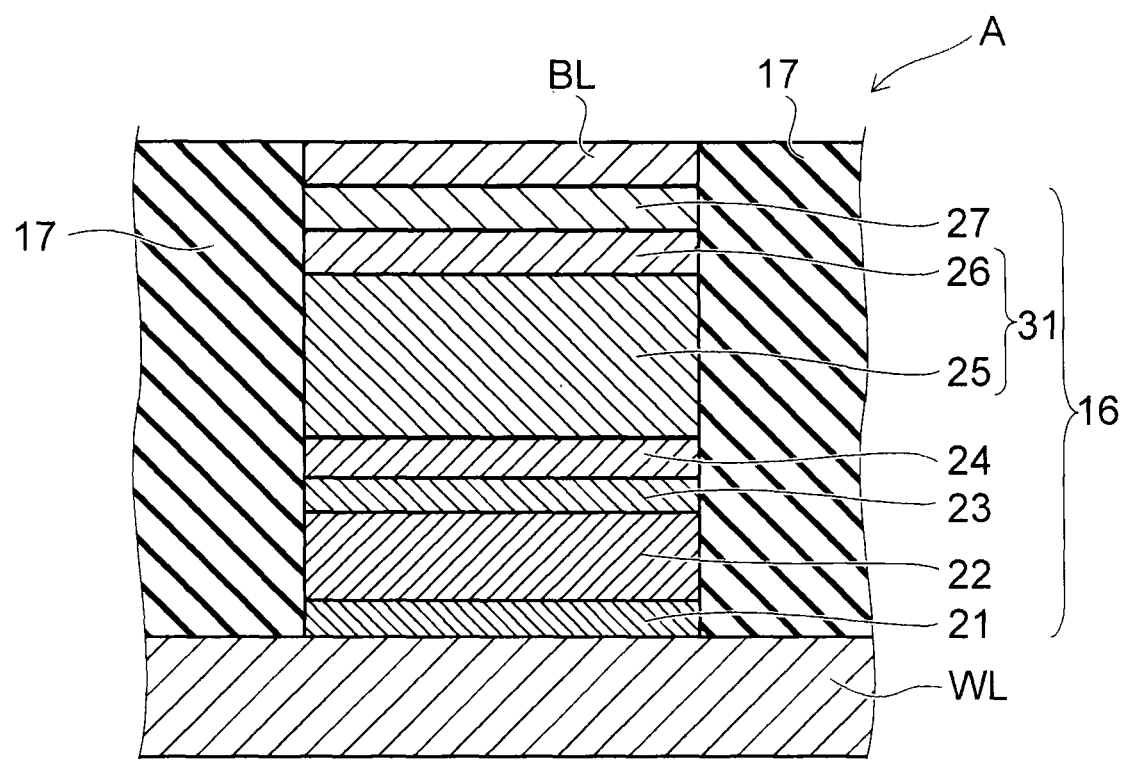
FIG. 2 is a cross-sectional view illustrating a portion shown in FIG. 1.

FIG. 2 is a cross-sectional view illustrating a portion shown in FIG. 1.

Figure 3:
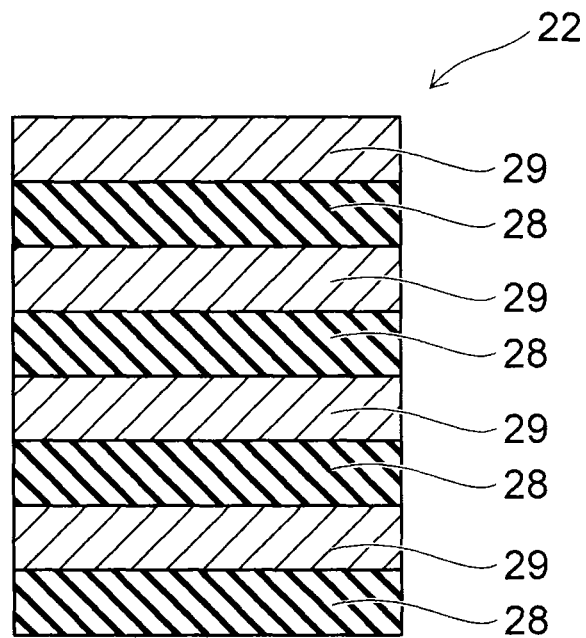
FIG. 3 is a cross-sectional view illustrating a conductive layer of the resistive random access memory device according to the first embodiment.

FIG. 3 is a cross-sectional view illustrating a conductive layer of the resistive random access memory device according to the embodiment.

Figure 4A:
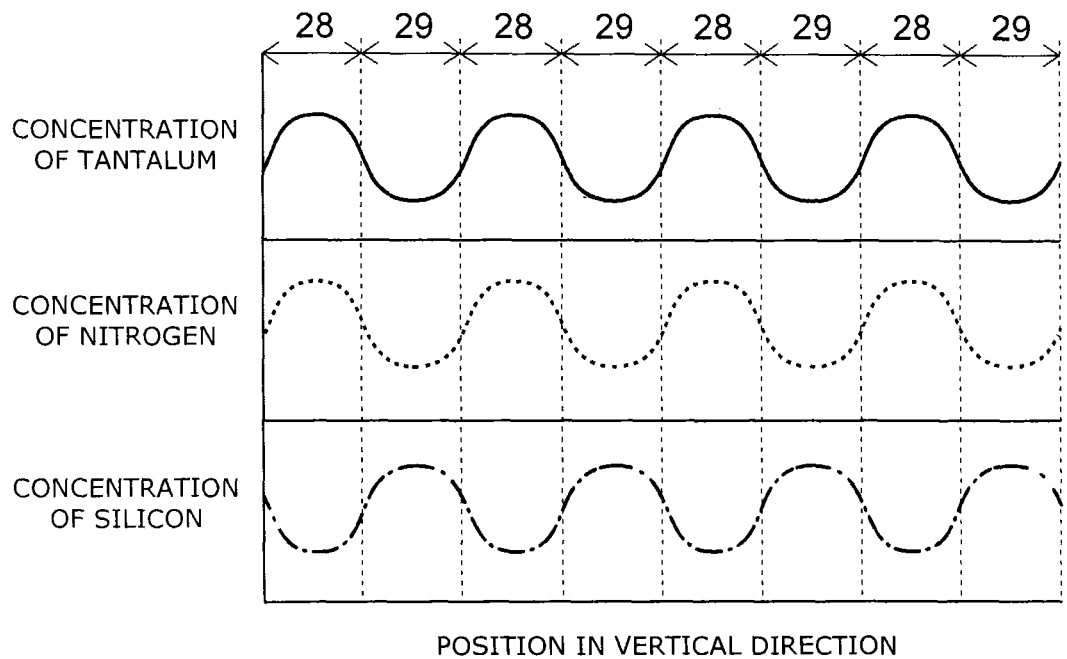
FIG. 4A is a graph illustrating a concentration profile of tantalum, silicon and nitrogen in the conductive layer of the resistive random access memory device according to the embodiment, wherein the abscissa represents a position in the vertical direction and the ordinate represents the concentration.

FIG. 4A is a graph illustrating a concentration profile of tantalum, silicon and nitrogen in the conductive layer of the resistive random access memory device according to the embodiment, wherein the abscissa represents a position in the vertical direction and the ordinate represents the concentration.

Figure 4B:
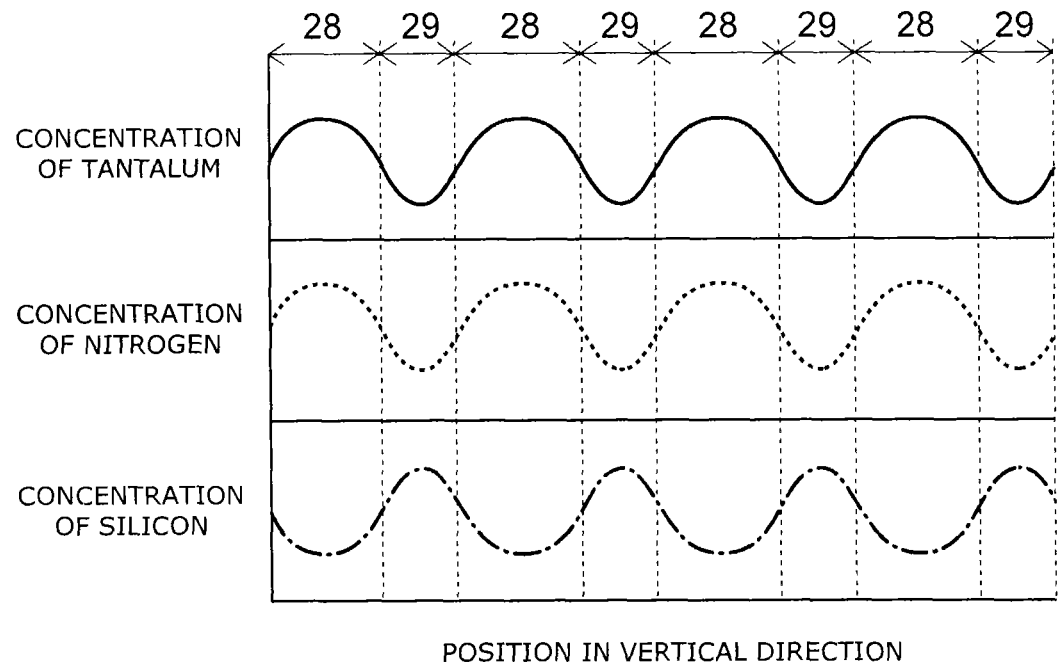
FIG. 4B is a graph illustrating a concentration profile of tantalum, silicon and nitrogen in the conductive layer of the resistive random access memory device according to the embodiment, wherein the abscissa represents a position in the vertical direction and the ordinate represents the concentration.

FIG. 4B is a graph illustrating a concentration profile of tantalum, silicon and nitrogen in the conductive layer of the resistive random access memory device according to the embodiment, wherein the abscissa represents a position in the vertical direction and the ordinate represents the concentration.

The resistive random access memory device according to the embodiment is a CBRAM (conduction-bridge RAM).

As shown in FIG. 1, a resistive random access memory device 1 according to the embodiment is provided with a silicon substrate 11, and a driving circuit (not shown) of the resistive random access memory device 1 is formed in an upper layer portion and on an upper surface of the silicon substrate 11. On the silicon substrate 11, an interlayer insulating film 12 composed of, for example, silicon oxide is provided so as to bury the driving circuit therein, and on the interlayer insulating film 12, a memory cell section 13 is provided.

In the memory cell section 13, a word line wiring layer 14 including a plurality of word lines WL extending in a direction parallel to the upper surface of the silicon substrate 11 (hereinafter referred to as "word line direction") and a bit line wiring layer 15 including a plurality of bit lines BL extending in a direction which is parallel to the upper surface of the silicon substrate 11 and intersects, for example, is orthogonal to the word line direction (hereinafter referred to as "bit line direction") are alternately stacked on each other. The adjacent word lines WL, the adjacent bit lines BL, and the adjacent word line WL and bit line BL are not in contact with each other. The word lines WL and the bit lines BL are formed from, for example, silicon (Si), tungsten (W), Carbon (C) and so on.

At a nearest neighbor point of each of the word lines WL and each of the bit lines BL, a pillar 16 extending in a direction perpendicular to the upper surface of the silicon substrate 11 (hereinafter referred to as "vertical direction") is provided. The shape of the pillar 16 is, for example, a cylinder, a quadrangular prism, or a substantially quadrangular prism with rounded edges. The pillar 16 is formed between the word line WL and the bit line BL, and one memory cell MC is constituted by one pillar 16. The resistive random access memory device 1 is a cross-point type device in which the pillar 16 is disposed at every nearest neighbor point of each of the word lines WL and each of the bit lines BL. Spaces among the word lines WL, the bit lines BL, and the pillars 16 are filled with an interlayer insulating film 17 (see FIG. 2).

Next, the pillar 16 will be described.

As shown in FIG. 2, in the pillar 16 of the resistive random access memory device according to the embodiment, a lower barrier metal layer 21, a conductive layer 22, an upper barrier metal layer 23, a lower electrode 24, a variable resistance layer 25, a metal layer 26, and an upper electrode 27 are stacked in this order from the word line WL side to the bit line BL side.

The variable resistance layer 25 and the metal layer 26 are collectively referred to as a resistance change layer 31.

The lower barrier metal layer 21 is a layer which prevents a material of the word line WL from diffusing in the pillar 16. The upper barrier metal layer 23 is a layer which prevents a material of the lower electrode 24 from diffusing in the conductive layer 22. The lower barrier metal layer 21 and the upper barrier metal layer 23 are formed from, for example, tungsten nitride (WN) or tantalum nitride (TaN).

As shown in FIG. 3, the conductive layer 22 is formed by alternately stacking a tantalum nitride layer 28 composed of tantalum nitride (TaN) and a silicon layer 29 composed of silicon (Si). Each tantalum nitride layer 28 and each silicon layer 29 have a thickness of, for example, about 1 nm (nanometer), and the thickness of the conductive layer 22 as a whole is, for example, 20 nm. The boundary surface between the tantalum nitride layer 28 and the silicon layer 29 is not always able to be clearly observed. When the concentration profile of tantalum, silicon and nitrogen along the vertical direction in the conductive layer 22 is measured, for example, a graph as shown in FIG. 4A is obtained. As shown in FIG. 4A, the concentration profile of tantalum, silicon and nitrogen in the conductive layer 22 periodically fluctuates and repeats high and low concentrations. In other words, when focusing on one atom, a coarse part and a dense part are being repeated. In FIG. 4A, a layer which has high concentrations of tantalum and silicon corresponds to a tantalum nitride layer 28 and a layer which has a high concentration of silicon corresponds to a silicon layer 29. The thickness of the tantalum nitride layer 28 and the silicon layer 29 can be designed depending on a resistance value required for the conductive layer 22. When a lower resistance value is required, the thickness of the tantalum nitride layer 28 is thickened and the thickness of the silicon layer 29 is thinned. The concentration profile is shown in FIG. 4B for the case of the ratio (the thickness of the tantalum nitride layer 28: the thickness of the silicon layer 29) is equal to the ratio (3:2). The other way is that when a higher resistance value is required, the thickness of the tantalum nitride layer 28 is thinned and the thickness of the silicon layer 29 is thickened. For example, the ratio (the thickness of the tantalum nitride layer 28: the thickness of the silicon layer 29) range is favorable approximately to be from ratio (1:5) to ratio (5:1). Each of the thickness of the tantalum nitride layer 28 and the thickness of the silicon layer 29 is favorable, for example, approximately to be equal to or more than 0.2 nanometers and equal to or lower than 2.0 nanometers.

The concentration profiles of tantalum, silicon and nitrogen shown in FIG. 4A do not show the absolute concentration. The concentration profiles which are shown in FIG. 4A show a high and a low concentration in the each element. For example, the concentrations of the tantalum and the nitrogen in the silicon layer 29 are lower than the concentration of those in the tantalum nitride layer 28. The concentration of the silicon in the silicon layer 29 is higher than the concentration of that in the tantalum nitride layer 28.

The resistivity of the conductive layer 22 as a whole is higher than the material to be used for the word line WL or the bit line BL, and the current-voltage characteristics are substantially linear.

The lower electrode 24 is formed from, for example, tungsten (W), and is connected to the upper barrier metal layer 23 and the variable resistance layer 25.

The variable resistance layer 25 is connected to the lower electrode 24 and the metal layer 26. For the variable resistance layer 25, for example, one or more material selected from the group consisting of silicon, silicon oxide, silicon nitride, silicon oxynitride, and a metal oxide can be used. As the metal oxide, for example, one or more material selected from the group consisting of hafnium oxide, zirconium oxide, aluminum oxide, titanium oxide, tantalum oxide, nickel oxide, tungsten oxide, and vanadium oxide can be used. Other than these, for the variable resistance layer 25, an ion conductive material can be used. Examples of the ion conductive material include silver oxide (e.g. $Ag_2O$), silver sulfide (e.g. $Ag_2S$), silver selenide (e.g. $Ag_2Se$), silver telluride (e.g. $Ag_2Te$), silver iodide (e.g. AgI), copper iodide (e.g. $CuI_2$), copper oxide (e.g. CuO), copper sulfide (e.g. CuS), copper selenide (e.g. CuSe), copper telluride (e.g. CuTe), and germanium oxide (e.g. $GeO_2$). Further, the variable resistance layer 25 may have a structure in which a plurality of layers including any of these materials are stacked. These materials can be used without being limited to the specific compositional ratio described herein.

The metal layer 26 is connected to the variable resistance layer 25 and the upper electrode 27. The material of the metal layer 26 may be, for example, one or more metal selected from the group consisting of silver (Ag), copper (Cu), zinc (Zn), gold (Au), titanium (Ti), nickel (Ni), cobalt (Co), tantalum (Ta), aluminum (Al), and bismuth (Bi), or an alloy, a nitride, or a silicide including one or more metal selected therefrom. As the alloy, for example, in the case of a copper alloy, examples thereof include CuTe and Cu-GST ($Ge_2Sb_2Te_5$). Further, the metal layer 26 may have a structure in which a plurality of layers including these materials are stacked. These materials can be used without being limited to the specific compositional ratio described herein.

The upper electrode 27 is formed from, for example, tungsten (W), and is connected to the metal layer 26 and the bit line BL.

Next, a method of manufacturing a resistive random access memory device according to the embodiment will be described.

Figure 5:
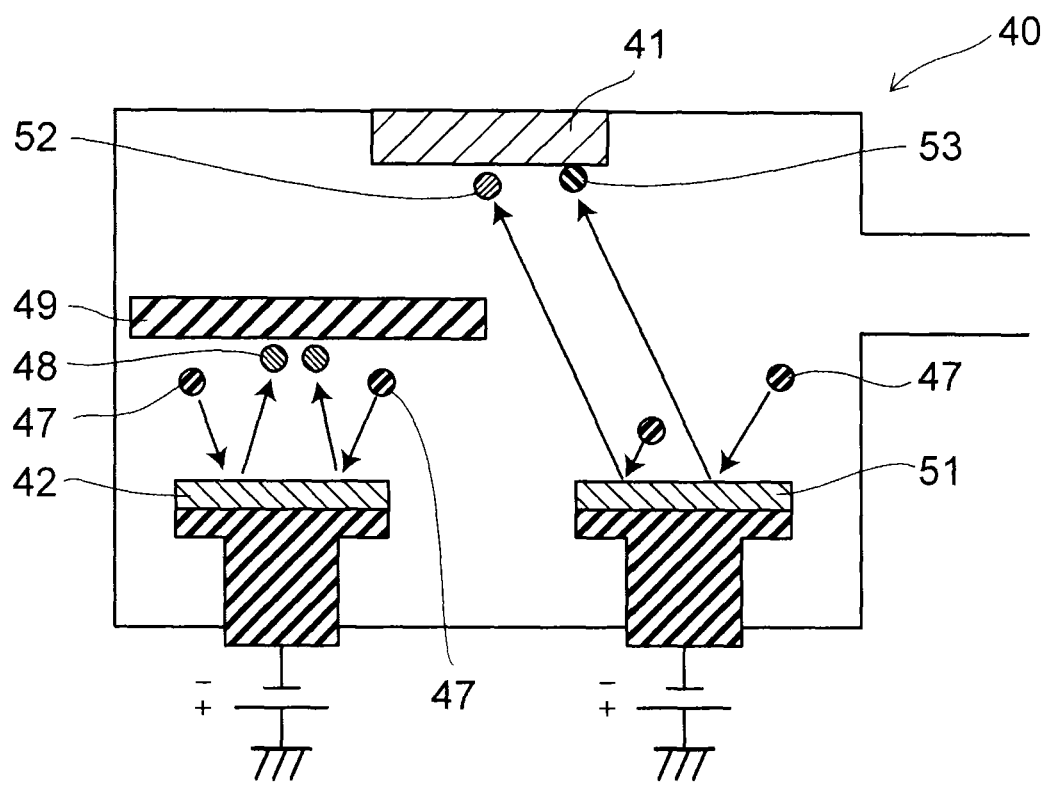
FIG. 5 is a view illustrating a method of manufacturing a resistive random access memory device according to the first embodiment using a sputtering method.

FIG. 5 is a view illustrating a method of manufacturing a resistive random access memory device according to the embodiment using a sputtering method.

First, as shown in FIG. 1, an interlayer insulating film 12 is formed on a silicon substrate 11.

Subsequently, word lines WL are formed by, for example, a damascene method.

Subsequently, on the word lines WL, a lower barrier metal layer 21 is formed.

Subsequently, on the lower barrier metal layer 21, a conductive layer 22 is formed. The conductive layer 22 is formed by, for example, alternately depositing silicon (Si) and tantalum nitride (TaN) using a sputtering method.

Specifically, as shown in FIG. 5, in a chamber 40 of a sputtering deposition apparatus, an intermediate structure 41 in which members up to the lower barrier metal layer 21 are formed on the silicon substrate 11 is placed, and at a position facing the intermediate structure 41, a target 51 composed of tantalum nitride and a target 42 composed of silicon are placed. Then, the chamber is evacuated to vacuum. While disposing a shutter 49 at a position so as to cover the target 42, for example, argon is introduced into the chamber and ionized. As a result, an argon ion 47 hits the target 51, and a tantalum atom 52 and a nitrogen atom 53 sputtered from the target 51 are deposited on the intermediate structure 41, whereby a tantalum nitride layer 28 is formed. Subsequently, the shutter 49 is transferred to a position so as to cover the target 51. By doing this, an argon ion 47 hits the target 42, and a silicon atom 48 sputtered from the target 42 is deposited on the intermediate structure 41, whereby a silicon layer 29 is formed. Thereafter, by repeating the transfer of the shutter 49, the tantalum nitride layer 28 and the silicon layer 29 are alternately formed.

Subsequently, an upper barrier metal layer 23 is formed on the conductive layer 22. Then, on the upper barrier metal layer 23, a lower electrode 24 is formed. Then, on the lower electrode 24, a variable resistance layer 25 is formed. Then, on the variable resistance layer 25, a metal layer 26 is formed. Then, on the metal layer 26, an upper electrode 27 is formed.

Subsequently, on the upper electrode 27, a mask (not shown) is formed and etching is performed, whereby a portion which is not covered with the mask is removed in the stacked body in which members from the lower barrier metal layer 21 to the upper electrode 27 are stacked, and thus, a pillar 16 is formed. Thereafter, spaces between the pillars 16 are filled with an interlayer insulating film 17.

Subsequently, on the upper electrode 27 and the interlayer insulating film 17, bit lines BL are formed in the same manner as in the case of forming the word lines WL.

Thereafter, the pillars 16, the word lines WL, the pillars 16, and the bit lines BL are formed repeatedly in the same manner as described above, whereby a resistive random access memory device 1 is manufactured.

Next, an operation of the resistive random access memory device according to the embodiment will be described.

Figures 6A, 6B:
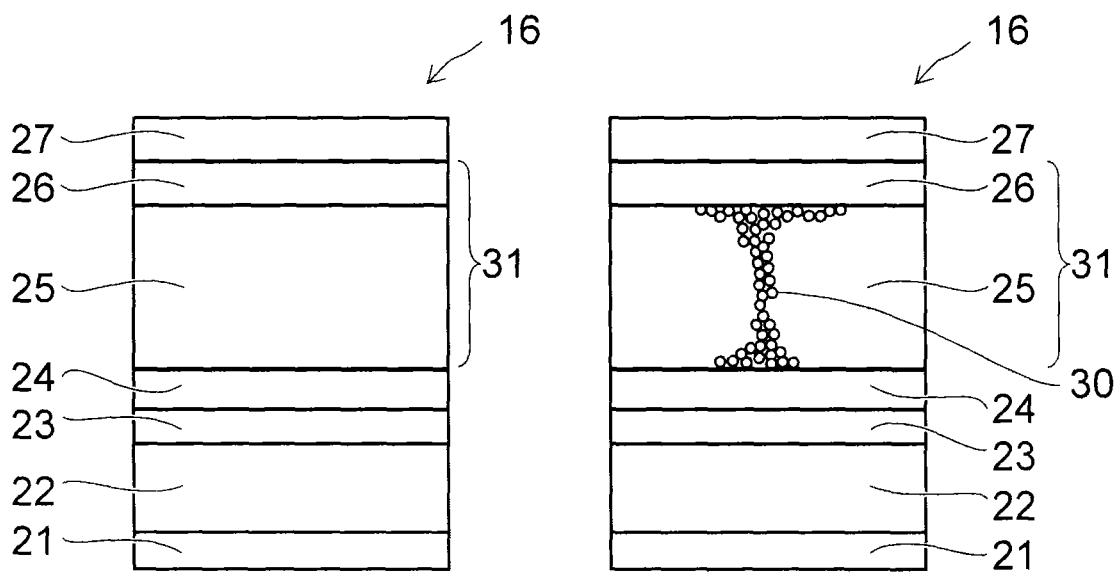
FIGS. 6A and 6B are cross-sectional views illustrating an operation of the resistive random access memory device according to the first embodiment.

FIGS. 6A and 6B are cross-sectional views illustrating an operation of the resistive random access memory device according to the embodiment. FIG. 6A shows a case where the variable resistance layer 25 is in a high-resistance state and FIG. 6B shows a case where the variable resistance layer 25 is in a low-resistance state.

Figure 7:
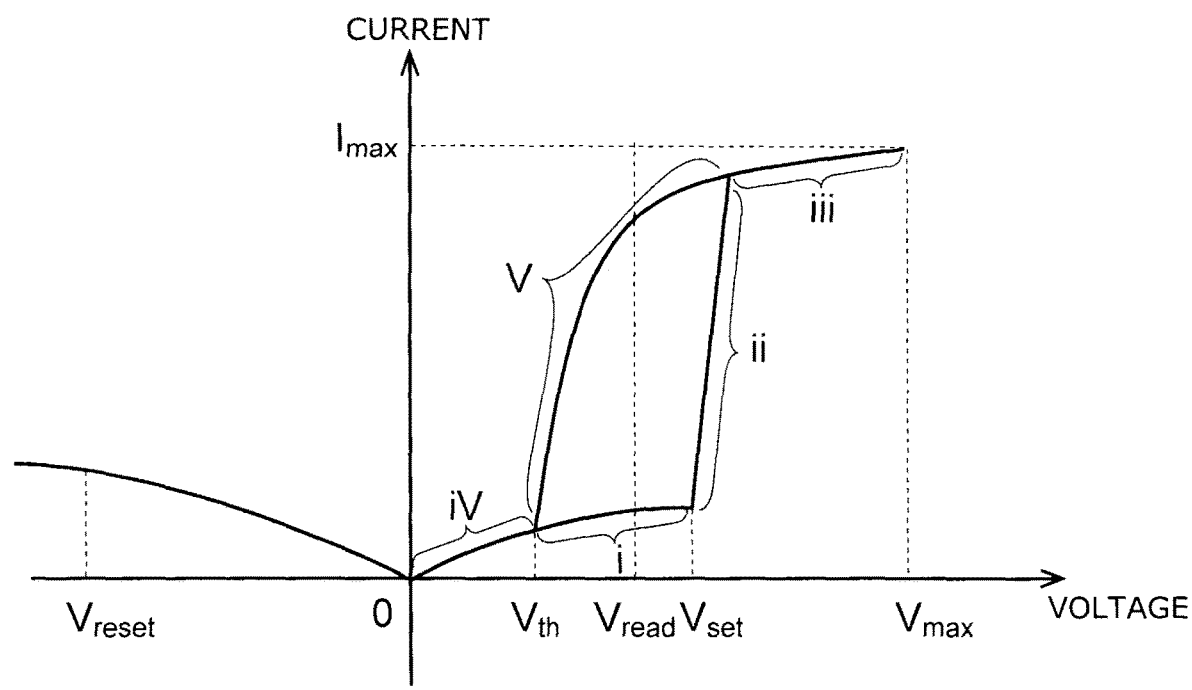
FIG. 7 is a graph illustrating the current-voltage characteristics of the resistive random access memory device according to the first embodiment.

FIG. 7 is a graph illustrating the current-voltage characteristics of the resistive random access memory device according to the embodiment. The abscissa of the graph represents a voltage applied between the lower electrode 24 and the upper electrode 27, and the ordinate represents the absolute value of a current flowing between the upper electrode 27 and the lower electrode 24.

First, when a voltage (positive voltage) is applied to the pillar 16 in a state shown in FIG. 6A such that the lower electrode 24 is used as a negative electrode and the upper electrode 27 is used as a positive electrode, as the portions iv and i shown in FIG. 7, the current increases with an increase in the voltage. Then, when the voltage reaches a set voltage Vset, as the portion ii shown in FIG. 7, the current rapidly increases.

This is because before applying the set voltage Vset, the variable resistance layer 25 is in a high-resistance state as shown in FIG. 6A, however, by applying the set voltage Vset, the variable resistance layer 25 changes to a low-resistance state as shown in FIG. 6B. That is, when applying the set voltage Vset, for example, a part of silver atoms (Ag) included in the metal layer 26 formed from silver (Ag) are ionized to be converted to silver ions ($Ag^+$) and move toward the lower electrode 24 and permeate the variable resistance layer 25. Then, these silver ions are coupled with electrons ($e^-$) supplied from the lower electrode 24, whereby silver atoms are deposited. As a result, a filament 30 composed mainly of silver is formed in the variable resistance layer 25 so that the variable resistance layer 25 changes from a high-resistance state to a low-resistance state, and thus, the current rapidly increases. This operation is called "SET".

Thereafter, even if the maximum voltage Vmax is applied, the current is restrained by the conductive layer 22, and an excessive current exceeding the maximum current Imax as the portion iii shown in FIG. 7 never flows. This is because by providing the conductive layer 22, a sufficient resistance is interposed between the upper electrode 27 and the lower electrode 24.

After the filament 30 is formed, the current begins to increase rapidly from the threshold voltage Vth which is lower than before forming the filament 30, and the current changes along the portions iv-v-iii in FIG. 7.

On the other hand, when a voltage (reverse voltage) is applied to the pillar 16 in a state shown in FIG. 6B such that the lower electrode 24 is used as a positive electrode and the upper electrode 27 is used as a negative electrode, and the absolute value thereof is made larger than the absolute value of a reset voltage Vreset, the variable resistance layer 25 changes from a low-resistance state to a high-resistance state.

This is because by applying the reverse voltage whose absolute value is larger than that of the reset voltage Vreset, the silver atoms forming the filament 30 are ionized again to be converted to silver ions and move toward the upper electrode 27. Then, in the metal layer 26, the silver ions are coupled with electrons supplied from the upper electrode 27 and return to silver atoms again, and therefore, at least a part of the filament 30 in the variable resistance layer 25 is lost. This operation is called "RESET". When the variable resistance layer 25 is in a high-resistance state, the current changes along the portions iv-i-ii-iii in FIG. 7.

When the variable resistance layer 25 is put into a high-resistance state once, the high-resistance state is maintained unless the voltage is made higher than the set voltage Vset. Further, when the variable resistance layer 25 is put into a low-resistance state once, the low-resistance state is maintained unless a reverse voltage whose absolute value is larger than that of the reset voltage Vreset is applied.

As shown in FIG. 7A, when a current applying the positive voltage is higher than a current applying the negative voltage, a sneak current is favorably suppressed in a memory with a cross-point structure.

Next, an effect of the embodiment will be described.

In the embodiment, the conductive layer 22 is formed by alternately stacking the tantalum nitride layer 28 and the silicon layer 29 on each other.

By using silicon having high conductive properties and tantalum nitride having high insulating properties as the materials of the conductive layer 22, the conductive layer 22 which has a favorable resistivity and also having substantially linear current-voltage characteristics can be realized. As a result, the voltage applied to the cell is distributed, and the breakdown of the resistive random access memory device due to an excessive current flowing through the resistance change layer 31 can be prevented.

In the embodiment, when the conductive layer 22 is formed, by performing sputtering alternately using the target 42 composed of silicon and the target 51 composed of tantalum nitride, the tantalum nitride layer 28 and the silicon layer 29 are alternately stacked on each other. Due to this, relatively soft targets can be used as the sputtering targets, and thus, little dust is generated accompanying sputtering.

On the other hand, it is also contemplated that as the conductive layer 22, a single layer film composed of tantalum silicon nitride (TaSiN) is used. Also in this case, a conductive layer which has a high resistivity and also has favorable linear current-voltage characteristics can be obtained. However, in this case, when the conductive layer is formed by a sputtering method, a target composed of tantalum silicon nitride (TaSiN), which is a hard intermetallic compound, is used, and thus, a large amount of dust is generated accompanying sputtering.

Furthermore, according to the embodiment, by selecting the number of stacked layers of the tantalum nitride layer 28 and the silicon layer 29, the resistance value of the conductive layer 22 can be set at will, and therefore, the degree of freedom of design of the device can be increased.

According to the embodiment, the conductive layer 22 is provided between the word line WL and the resistance change layer 31, and therefore, impurities from the word line WL can be prevented from diffusing.

Next, a variation of the first embodiment will be described.

Figure 8:
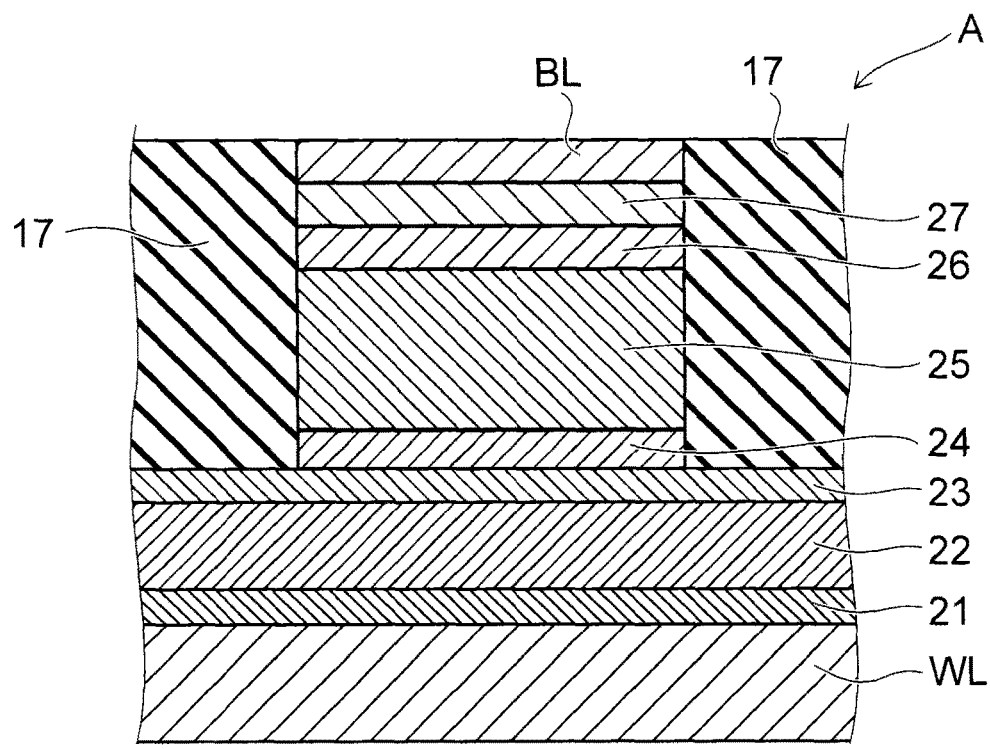
FIG. 8 is a cross-sectional view illustrating a resistive random access memory device according to a variation of the first embodiment.

FIG. 8 is a cross-sectional view illustrating a resistive random access memory device according to the variation.

As shown in FIG. 8, a lower barrier metal layer 21, a conductive layer 22 and an upper barrier metal layer 23 are provided in this order on the whole upper surface of the word line WL and a lower electrode 24, a variable resistance layer 25, a metal layer 26, and an upper electrode 27 are provided in this order on an intersection portion of the upper barrier metal layer 23 with the bit line BL.

The structure, manufacturing method and effect of the variation other than the above are the same as those of the first embodiment described above.

Next, a second embodiment will be described.

The resistive random access memory device according to the embodiment is a CBRAM (conduction-bridge RAM).

Figure 9:
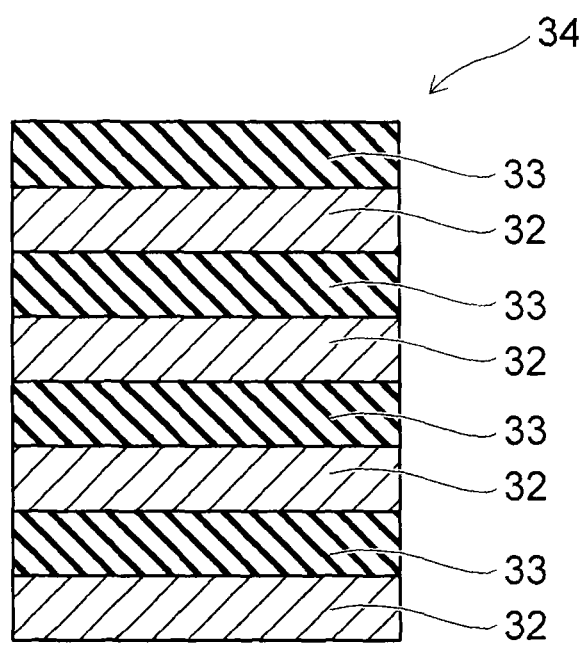
FIG. 9 is a cross-sectional view illustrating a conductive layer of the resistive random access memory device according to a second embodiment.

FIG. 9 is a cross-sectional view illustrating a conductive layer of the resistive random access memory device according to the embodiment.

As shown in FIG. 9, a conductive layer 34 of the resistive random access memory device according to the embodiment is different from the conductive layer 22 (see FIG. 3) of the resistive random access memory device according to the first embodiment described above in that an aluminum layer 32 composed of aluminum (Al) and an aluminum nitride layer 33 composed of aluminum nitride (AlN) are alternately stacked on each other.

In the same manner as in the first embodiment, also the boundary surface between the aluminum layer 32 and the aluminum nitride layer 33 according to the embodiment is not always able to be clearly observed. The concentration profile of nitrogen (N) along the vertical direction in the conductive layer 34 periodically fluctuates in the same manner as in the first embodiment.

The configuration of the embodiment other than the above is the same as that of the first embodiment described above.

Next, a method of manufacturing a resistive random access memory device according to the embodiment will be described.

Figure 10A:
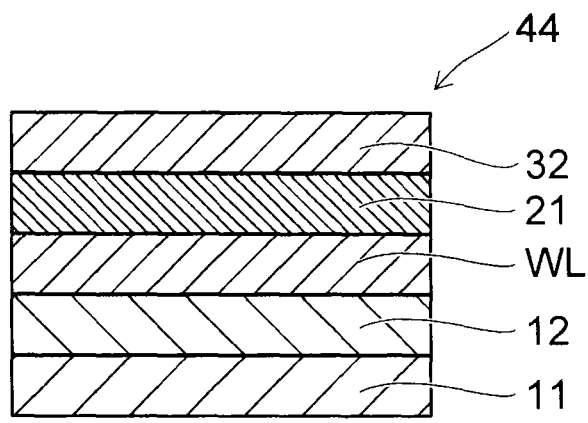
FIGS. 10A to 10C are cross-sectional views illustrating a method of manufacturing the conductive layer 34 according to the second embodiment.
Figure 10B:
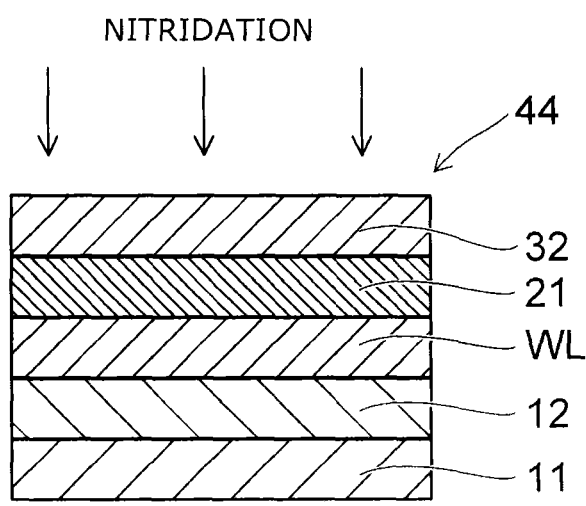
Figure 10C:
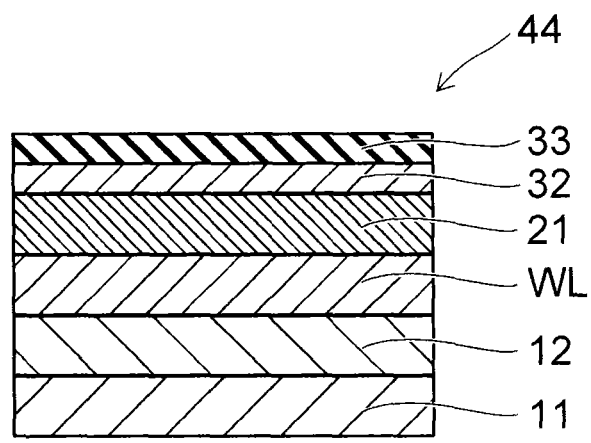

FIGS. 10A to 10C are cross-sectional views illustrating a method of manufacturing the conductive layer 34 according to the embodiment.

First, a method of forming members from an interlayer insulating film 12 to a lower barrier metal layer 21 on a silicon substrate 11 is the same as that of the first embodiment.

Subsequently, the conductive layer 34 is formed on the lower barrier metal layer 21. A method of forming the conductive layer 34 will be described below.

First, as shown in FIG. 10A, on the lower barrier metal layer 21, an aluminum layer 32 is formed. Subsequently, as shown in FIG. 10B, the surface of the aluminum layer 32 is nitridated. For example, an intermediate structure 44 in which members up to the aluminum layer 32 are formed on the silicon substrate 11 is heated in a nitrogen atmosphere to allow nitrogen to permeate the vicinity of the surface of the aluminum layer 32, whereby the surface of the aluminum layer 32 is nitridated. As a result of the nitridation treatment, nitridation proceeds inward from the surface of the aluminum layer 32, and then, as shown in FIG. 10C, a portion of the aluminum layer 32 is nitridated, whereby an aluminum nitride layer 33 is formed. Thereafter, by alternately repeating the deposition of the aluminum layer 32 and the nitridation treatment, the conductive layer 34 is formed.

The manufacturing method, operation, and effect of the embodiment other than the above are the same as those of the first embodiment described above.

Next, a third embodiment will be described.

The resistive random access memory device according to the embodiment is a ReRAM.

Figure 11:
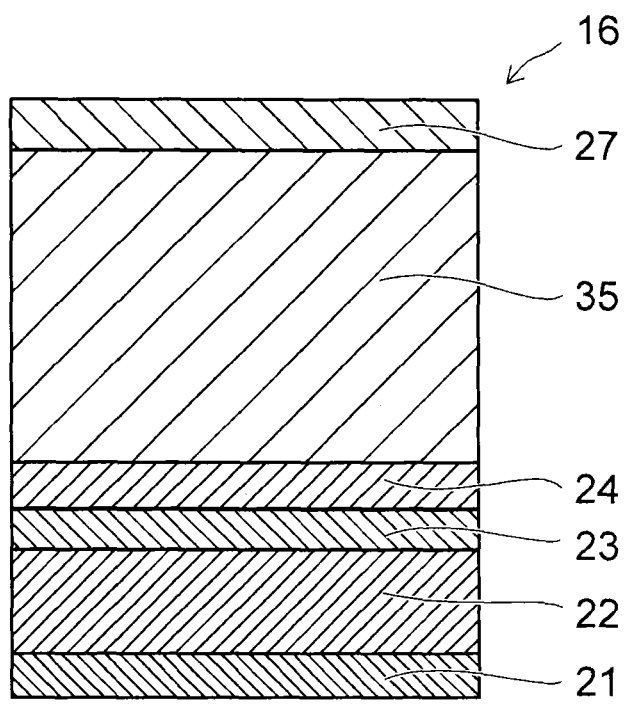
FIG. 11 is a cross-sectional view illustrating a pillar of the resistive random access memory device according to a third embodiment.

FIG. 11 is a cross-sectional view illustrating a pillar of the resistive random access memory device according to the embodiment.

As shown in FIG. 11, a pillar 16 of the resistive random access memory device according to the embodiment is different from the pillar 16 (see FIG. 2) of the resistive random access memory device according to the first embodiment described above in that a resistance change layer 35 is provided in place of the variable resistance layer 25 and the metal layer 26. The resistance change layer 35 is formed from, for example, a metal oxide such as hafnium oxide, titanium oxide, or zinc oxide, or a carbon or chalcogenide material.

Next, a method of manufacturing a resistive random access memory device according to the embodiment will be described.

The method of manufacturing a resistive random access memory device according to the embodiment is different from the method of manufacturing a resistive random access memory device according to the first embodiment described above in that in place of forming the variable resistance layer 25 and the metal layer 26, the resistance change layer 35 is formed on the lower electrode 24.

Next, an operation of the resistive random access memory device according to the embodiment will be described.

When a set voltage Vset is applied to the pillar 16 of the resistive random access memory device shown in FIG. 11, for example, oxygen vacancies are generated in the resistance change layer 35 formed from a metal oxide. Due to the generation of oxygen vacancies, a filament is formed and the resistance change layer 35 changes from a high-resistance state to a low-resistance state.

The configuration, manufacturing method, operation, and effect of the embodiment other than the above are the same as those of the first embodiment described above.

Next, a fourth embodiment will be described.

Figure 12:
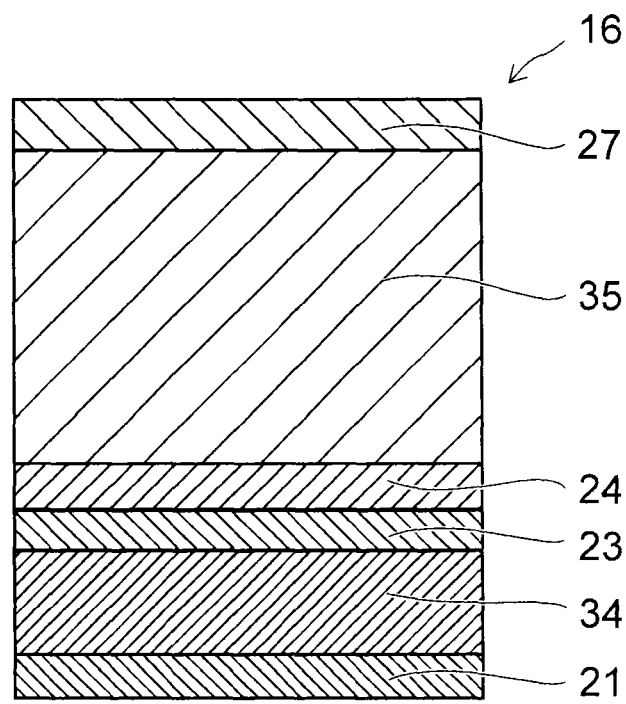
FIG. 12 is a cross-sectional view illustrating a pillar of the resistive random access memory device according to a forth embodiment.

FIG. 12 is a cross-sectional view illustrating a pillar of the resistive random access memory device according to the embodiment.

In the resistive random access memory device according to the embodiment, a conductive layer composed of the stacked film (Al/AlN) described in the above second embodiment is provided for the ReRAM described in the above third embodiment.

More specifically, the overall structure of the resistive random access memory device according to the embodiment is a cross-point structure as shown in FIG. 1, and the configuration of each pillar 16 is such that a resistance change layer 35 composed of a metal oxide, a conductive layer 34, etc., are provided as shown in FIG. 12. Further, as shown in FIG. 9, the conductive layer 34 is formed by alternately stacking an aluminum layer 32 and an aluminum nitride layer 33 on each other.

The configuration, manufacturing method, operation, and effect of the embodiment other than the above are the same as those of the third embodiment described above.

In the above-described first embodiment, a case where as the materials to be alternately stacked on each other in the conductive layer 22, tantalum nitride and silicon are used is shown, however, the materials are not limited thereto. In place of tantalum nitride, a material including either of a metal element and nitrogen may be used, or a material including both of a metal element and nitrogen may be used.

The formation may be performed by using, for example, a material including one or more metal selected from the group consisting of titanium, tantalum, zirconium, aluminum, hafnium, molybdenum, tungsten, and vanadium in place of silicon, or the formation may be performed by using, for example, a material including a nitride or an oxide of one or more metal selected from the group consisting of silicon, titanium, tantalum, zirconium, aluminum, hafnium, molybdenum, tungsten, and vanadium in place of tantalum nitride.

In the above-described respective embodiments, a case where the concentration profile of tantalum along the vertical direction in the conductive layer 22 periodically fluctuates is shown, however, the concentration profile is not limited thereto, and a part of the concentration profile may periodically fluctuate, or the entire concentration profile may randomly fluctuate.

In the above-described respective embodiments, a case where the word line WL and the bit line BL are parallel to the silicon substrate 11 plane is described, however, the word line WL and the bit line BL are not limited thereto, and the word line WL and the bit line BL may be, for example, perpendicular to the silicon substrate 11 plane.

In the above-described respective embodiments, a CBRAM and a ReRAM are described by way of example, however, it is a matter of course that the device may be an element having an operating principle other than these, and the device may be, for example, a PCRAM (phase change memory), a molecular memory, or the like.

According to the embodiments described above, a resistive random access memory device provided with a conductive layer having a high resistivity and also having substantially linear current-voltage characteristics, and a method of manufacturing the same can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A resistive random access memory device, comprising:
    a first interconnection extending in a first direction;
    a barrier metal layer of tungsten nitride provided on the first interconnection;
    a stacked body layer provided on the barrier metal layer, the stacked body layer comprising a first material layer including a first material, the first material layer being different from a material of the barrier metal layer, and a second material layer including a second material which is different from the first material and the material of the barrier metal layer;

a first layer provided directly on the stacked body layer, the first layer including tungsten;

a resistance change layer provided on the first layer and comprising a germanium tellurium antimony;

a second interconnection provided above the resistance change layer and extending in a second direction intersecting the first direction; and a second layer including tungsten being disposed between the resistance change layer and the second interconnection, a length of the first interconnection in the first direction being longer than a length of the resistance change layer in the first direction, a length of the second interconnection in the second direction being longer than a length of the resistance change layer in the second direction, and the stacked body layer being disposed between the barrier metal layer and the first layer in a third direction, the third direction being orthogonal to the first direction and the second direction, wherein the first layer completely covers a lower surface of the resistance change layer and the second layer completely covers an upper surface of the resistance change layer.

2. The device according to claim 1, wherein the stacked body layer has resistivity higher than the resistivity of the first interconnection.

3. The device according to claim 1, wherein the first material includes a metal element.

4. The device according to claim 1, wherein the first material includes nitrogen.

5. The device according to claim 1, wherein the first material includes one or more selected from the group consisting of silicon, titanium, tantalum, zirconium, aluminum, hafnium, molybdenum, tungsten, and vanadium, and the second material includes a nitride or an oxide of one or more selected from the group consisting of silicon, titanium, tantalum, zirconium, aluminum, hafnium, molybdenum, tungsten, and vanadium.

6. The device according to claim 1, wherein the first material includes silicon.

7. The device according to claim 1, wherein the first material includes aluminum, and the second material comprises an aluminum nitride.

8. The device according to claim 1, wherein the resistance change layer comprises:

a metal layer including a germanium tellurium antimony; and a variable resistance layer, which has resistivity higher than resistivity of the metal layer, and in which the metal element included in the metal layer can move.

9. The device according to claim 1, further comprising another second material layer and another first material layer, and wherein one of the first material layers is in contact with two of the second material layers and is disposed between the two of the second material layers.

10. The device according to claim 1, wherein the stacked body layer, the first layer, the resistance change layer, and the second layer form a pillar.

11. The device according to claim 1, wherein the barrier metal layer directly contacts the first interconnection.

12. A resistive random access memory device, comprising:

a first interconnection extending in a first direction;

a barrier metal layer provided on the first interconnection, the barrier metal layer including a first material, the first material being tungsten nitride;

a first material layer provided on the barrier metal layer, the first material layer including a second material different from the first material;

a second material layer provided on the first material layer including a third material different from the first material and the second material;

a first layer provided above the second material layer, the first layer including the first material;

a resistance change layer provided on the first layer and including a germanium tellurium antimony;

a second interconnection provided above the resistance change layer and extending in a second direction intersecting the first direction;

and a second layer including tungsten being disposed between the resistance change layer and the second interconnection, a length of the first interconnection in the first direction being longer than a length of the resistance change layer in the first direction, a length of the second interconnection in the second direction being longer than a length of the resistance change layer in the second direction, wherein the first layer completely covers a lower surface of the resistance change layer and the second layer completely covers an upper surface of the resistance change layer.

13. The device according to claim 12, wherein the first material is tungsten.

14. The device according to claim 12, wherein the barrier metal layer and the first layer include tungsten nitride.

15. The device according to claim 12 further comprising: a third material layer provided on the second material layer including the second material.

16. The device according to claim 15 wherein the first layer is provided on the third material layer.

17. The device according to claim 15, wherein the first material layer, the second material layer, and the third material layer, the first layer, the resistance change layer, and the second layer form a pillar.

18. The device according to claim 15, wherein the first material layer, the second material layer and the third material layer consist of a stacked body layer, and the second material layer has resistivity higher than the resistivity of the first interconnection.

19. The device according to claim 12, wherein the second material layer has resistivity higher than the resistivity of the first interconnection.

20. The device according to claim 12, wherein the first material includes a metal element.

21. The device according to claim 12, wherein the first material includes one or more selected from the group consisting of silicon, titanium, tantalum, zirconium, aluminum, hafnium, molybdenum, tungsten, and vanadium, and the third material comprises a nitride or an oxide of one or more selected from the group consisting of silicon, titanium, tantalum, zirconium, aluminum, hafnium, molybdenum, tungsten, and vanadium.

22. The device according to claim 12, wherein the second material includes silicon.

23. The device according to claim 12, wherein the second material include aluminum, and
the third material includes an aluminum nitride.

24. The device according to claim 23, wherein the resistance change layer comprises:
a metal layer including a germanium tellurium antimony; and
a variable resistance layer, which has resistivity higher than resistivity of the metal layer, and in which the metal element included in the metal layer can move.

25. The device according to claim 12, wherein the barrier metal layer directly contacts the first interconnection.

* * * * *